(12) United States Patent
Park et al.

(10) Patent No.: US 7,132,308 B2
(45) Date of Patent: Nov. 7, 2006

(54) DUAL PANEL-TYPE ORGANIC ELECTROLUMINESCENT DISPLAY DEVICE AND METHOD OF FABRICATING THE SAME

(75) Inventors: Jae-Yong Park, Gyeonggi-do (KR); Choong-Keun Yoo, Incheon (KR); Ock-Hee Kim, Gyeonggi-do (KR); Nam-Yang Lee, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/119,794

(22) Filed: May 3, 2005

(65) Prior Publication Data
US 2005/0194589 A1    Sep. 8, 2005

Related U.S. Application Data

(62) Division of application No. 10/608,219, filed on Jun. 30, 2003, now Pat. No. 6,909,110.

(30) Foreign Application Priority Data
Jul. 18, 2002 (KR) ................................ 2002-41938

(51) Int. Cl.
*H01L 21/00* (2006.01)
(52) U.S. Cl. ................. 438/82; 257/448; 257/E51.022; 257/E51.026; 257/E25.032; 438/149; 438/99
(58) Field of Classification Search .................. 438/82, 438/149, FOR. 157, 99; 257/448, E51.022, 257/E51.026, E25.032
See application file for complete search history.

(56) References Cited

U.S. PATENT DOCUMENTS

| | | | |
|---|---|---|---|
| 6,175,345 | B1 * | 1/2001 | Kuribayashi et al. ......... 345/76 |
| 6,548,961 | B1 | 4/2003 | Barth et al. |
| 2002/0158577 | A1 | 10/2002 | Shimoda et al. |
| 2003/0127972 | A1 | 7/2003 | Han et al. |

FOREIGN PATENT DOCUMENTS

| | | |
|---|---|---|
| JP | 2001-117509 | 4/2001 |
| JP | 2001-177509 | 4/2001 |
| KR | 2002-0047889 | 6/2002 |
| KR | 2004-0079476 | 9/2004 |
| WO | WO-02/078101 | 10/2005 |

* cited by examiner

*Primary Examiner*—Michelle Estrada
*Assistant Examiner*—Nicholas J. Tobergte
(74) *Attorney, Agent, or Firm*—Morgan, Lewis & Bockius, LLP

(57) ABSTRACT

An organic electroluminescent display device includes first and second substrates facing and spaced apart from each other, the first and second substrates having a plurality of sub-pixel regions, a thin film transistor provided at each of the plurality of sub-pixel regions on an inner surface of the first substrate, a first electrode on an inner surface of the second substrate, an organic electroluminescent layer on the first electrode, a second electrode on the organic electroluminescent layer at each of the plurality of sub-pixel regions, and a connection pattern contacting the thin film transistor and the second electrode, wherein a melting temperature of the connection pattern is lower than a melting temperature of the second electrode.

22 Claims, 9 Drawing Sheets

Emission Direction

FIG. 3
Related Art

Emission Direction

DUAL PANEL-TYPE ORGANIC ELECTROLUMINESCENT DISPLAY DEVICE AND METHOD OF FABRICATING THE SAME

This application is a Divisional of U.S. patent application Ser. No. 10/608,219 filed on Jun. 30, 2003 now U.S. Pat. No. 6,909,110 and claims the benefit of Korean Patent Application No. 2002-41938 filed in Korea on Jul. 18, 2002, which are hereby incorporated by reference in their entirety.

BACKGROUND OF THE INVENTION

1. Field of the Invention

The present invention relates to an organic electroluminescent display device and a method of fabricating an organic electroluminescent display device, and more particularly, to a dual panel-type organic electroluminescent device and a method of fabricating a dual panel-type organic electroluminescent display device.

2. Discussion of the Related Art

Among various different types of flat panel display (FPD) devices, organic electroluminescent display (OELD) devices have been developed because of their light-emitting properties, wide viewing angles, and good contrast ratios, as compared with the liquid crystal display (LCD) devices. Since a backlight device is not necessary in the OELD devices, the OELD devices can be light weight and thin. In addition, the OELD devices have low power consumption. When driving OELD devices, a low voltage direct current (DC) can be used, whereby rapid response speeds can be obtained. Since the OELD devices are solid state devices, unlike the LCD devices, they are sufficiently strong to withstand external impact and have greater operational temperature ranges. In addition, the OELD devices can be manufactured at low costs. For example, since only deposition and encapsulation apparatus are necessary for manufacturing the OELD devices, manufacturing processes of the OELD devices are simple in contrast to the LCD devices and in contrast to plasma display panel (PDP) devices.

During an operation method for the OELD devices, a passive matrix operating method that does not use additional thin film transistors (TFTs) is used. However, since passive matrix-type OELD devices have limited resolution, high power consumption, and reduced operational lifetime, active matrix-type OELD devices have been developed as next generation display devices that require high resolution and large display area.

In passive matrix-type OELD devices, scanning lines and signal lines are arranged to perpendicularly cross each in a matrix configuration, whereas in the active matrix-type OELD devices, a TFT is disposed at each pixel region to function as a switch to turn a first electrode connected to the TFT ON and OFF, and a second electrode is provided to face the first electrode.

In the passive matrix-type OELD devices, a scanning voltage is sequentially supplied to the scanning lines to operate each pixel. Accordingly, in order to obtain a required average brightness, an instantaneous brightness of each pixel during the selection period should reach a value resulting from multiplying the average brightness by the total number of scanning lines. Thus, since supplied voltage and current increase as the total number of the scanning lines increases, the passive matrix-type OELD devices are not adequate to display high resolution images over a large display area due to the high power consumption.

However, in active matrix-type OELD devices, a voltage supplied to the pixel is stored in a storage capacitor, thereby maintaining the voltage and driving the device until a voltage of next frame is supplied regardless of the total number of the scanning lines. Accordingly, an equivalent brightness is obtained using low supplied current, wherein the active matrix-type OELD device operates having low power consumption and high image resolution over a large display.

Figure 1:
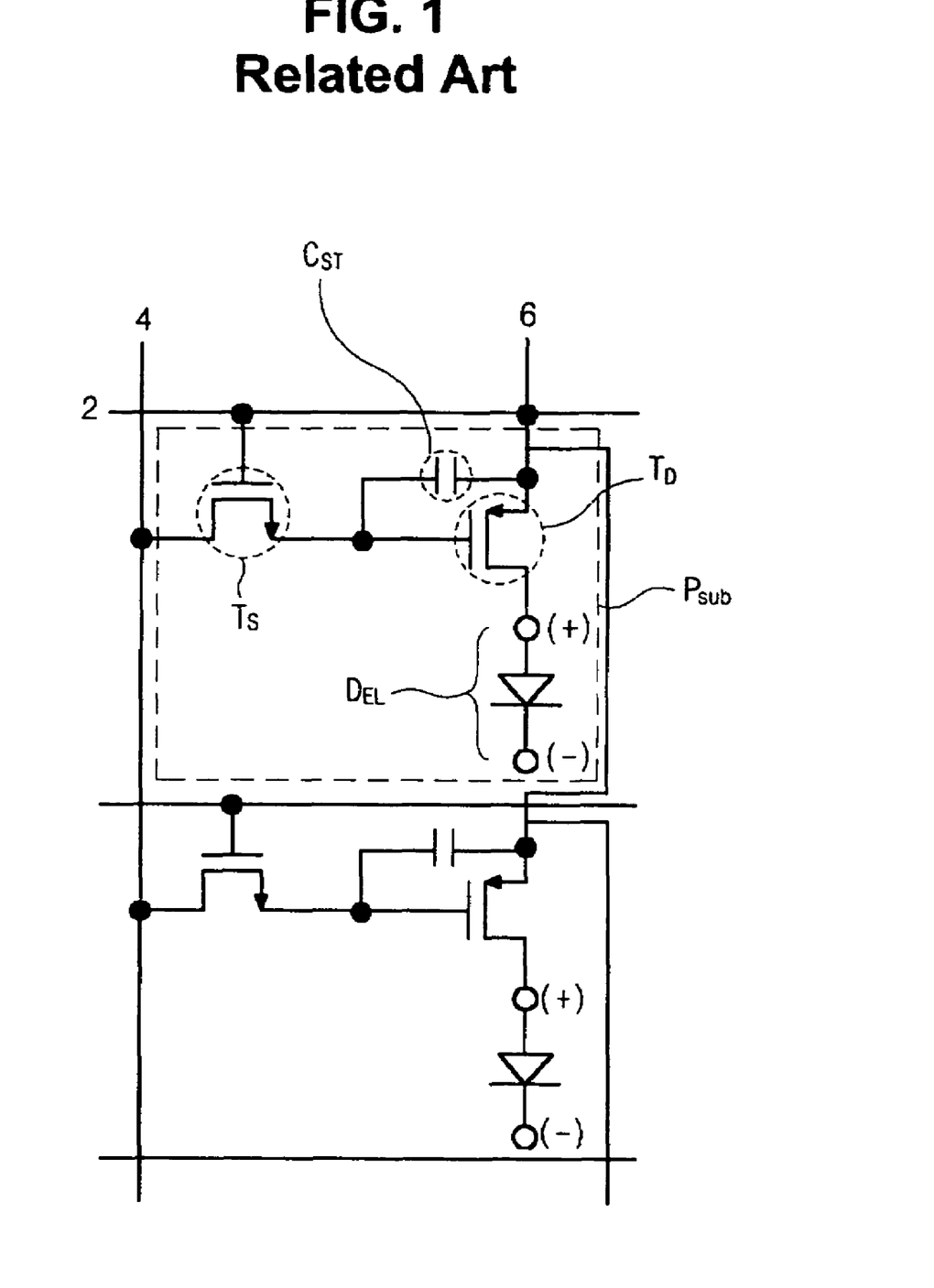
FIG. 1 is an equivalent circuit diagram of a basic pixel structure of an active matrix-type organic electroluminescent display device according to the related art.

FIG. 1 is an equivalent circuit diagram of a basic pixel structure of an active matrix-type organic electroluminescent display device according to the related art. In FIG. 1, a scanning line 2 is arranged along a first direction, and a signal line 4 and a power line 6 are arranged along a second direction perpendicular to the first direction, thereby defining a sub-pixel region "$P_{sub}$," wherein the signal line 4 and the power line 6 are spaced apart form each other. In addition, a switching TFT "$T_s$," which is commonly referred to as an addressing element, is connected to the scanning line 2 and the signal line 4, and a storage capacitor "$C_{ST}$" is connected to the switching TFT "$T_s$" and the power line 6. A driving TFT "$T_D$," commonly referred to as a current source element, is connected to the storage capacitor "$C_{ST}$" and the power line 6, and an organic electroluminescent (EL) diode "$D_{EL}$" is connected to the driving TFT "$T_D$."

The organic EL diode "$D_{EL}$" has an organic EL layer between an anode and a cathode. When a forward current is supplied to the organic EL diode "$D_{EL}$," an electron and hole are recombined to generate an electron-hole pair through a P-N (positive-negative) junction between the anode, which provides the hole, and the cathode, which provides the electron. Since the electron-hole pair has an energy lower than an energy of the separated electron and hole, an energy difference is created between the recombination and the separated electron-hole pair, whereby light is emitted due to the energy difference.

Two different types of organic EL devices exist according to a direction of light emitted from the organic EL diode: passive matrix-type and active matrix-type.

Figure 2:
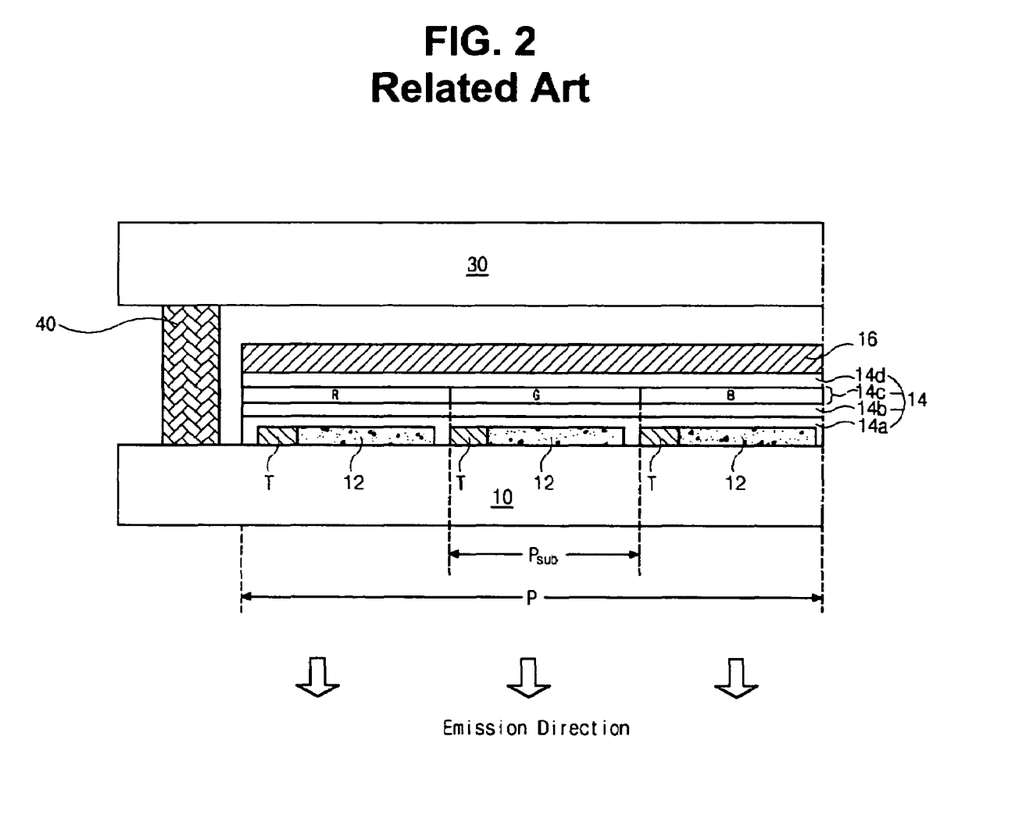
FIG. 2 is a schematic cross sectional view of a bottom emission-type organic electroluminescent display device according to the related art.

FIG. 2 is a schematic cross sectional view of a bottom emission-type organic electroluminescent display device according to the related art, wherein one pixel region includes red, green, and blue sub-pixel regions. In FIG. 2, first and second substrates 10 and 30 face and are spaced apart from each other, wherein a peripheral portion of the first and second substrates 10 and 30 are sealed together by a seal pattern 40. A thin film transistor (TFT) "T" is formed at each sub-pixel region "$P_{sub}$" on an inner surface of the first substrate 10, and a first electrode 12 is connected to the TFT "T." In addition, an organic electroluminescent layer 14 including luminescent materials of red, green, and blue is formed on the TFT "T" and the first electrode 12, and a second electrode 16 is formed on the organic electroluminescent layer 14. Accordingly, the first and second electrodes 12 and 16 supply an electric field to the organic electroluminescent layer 14. Although not shown, an adhesive and a moisture absorbent are formed on an inner surface of the second substrate 30 to shield the substrates from external moisture.

In the bottom emission-type OELD device, for example, the first electrode 12 functions as an anode and is made of a transparent conductive material, and the second electrode 16 functions as a cathode and is made of a metallic material of low work function. In addition, the organic electroluminescent layer 14 is composed of a hole injection layer 14a, a hole transporting layer 14b, an emission layer 14c, and a electron transporting layer 14d over the first electrode 12.

The emission layer 14c has a structure where emissive materials of red, green, and blue are alternately disposed at each sub-pixel region "$P_{sub}$."

Figure 3:
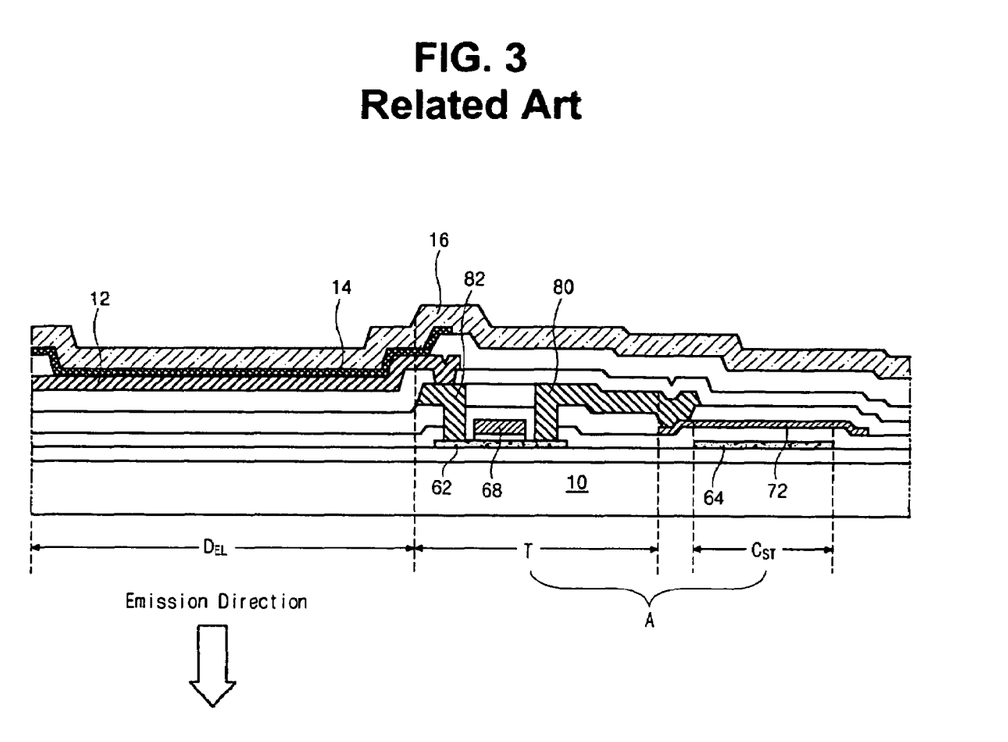
FIG. 3 is a schematic cross sectional view of a sub-pixel region of a bottom emission-type organic electroluminescent display device according to the related art.

FIG. 3 is a schematic cross sectional view of a sub-pixel region of a bottom emission-type organic electroluminescent display device according to the related art. In FIG. 3, a thin film transistor (TFT) "T" having a semiconductor layer 62, a gate electrode 68, and source and drain electrodes 80 and 82 is formed on a substrate 10. The source and drain electrodes 80 and 82 are connected to a power electrode 72 that extends from a power line (not shown) and an organic electroluminescent (EL) diode "$D_{EL}$," respectively. In addition, a storage capacitor "$C_{ST}$" includes the power electrode 72 and a capacitor electrode 64 facing each other with an insulating layer disposed between the power electrode 72 and the capacitor electrode 64, wherein the capacitor electrode 64 is made of the same material as the semiconductor layer 62.

In FIG. 3, the TFT "T" and the storage capacitor "$C_{ST}$" are collectively referred to as array elements "A," whereas the organic EL diode "$D_{EL}$" includes first and second electrodes 12 and 16 that face each other with an organic EL layer 14 disposed therebetween. The source electrode 80 of the TFT "T" is connected to the power electrode 72 of the storage capacitor "$C_{ST}$," and the drain electrode 82 of the TFT "T" is connected to the first electrode 12 of the organic EL diode "$D_{EL}$."

Figure 4:
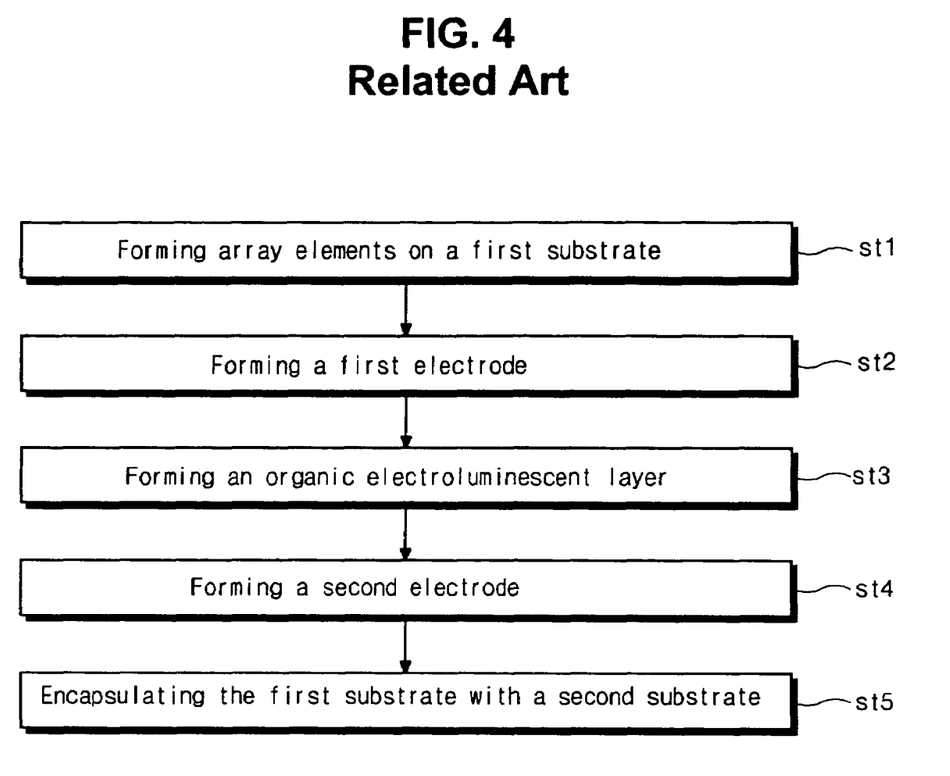
FIG. 4 is a flow chart showing a fabricating process of an organic electroluminescent display device according to the related art.

FIG. 4 is a flow chart showing a fabricating process of an organic electroluminescent display device according to the related art. In FIG. 4, at step st1, array elements are formed on a first substrate, wherein the array elements include a scanning line, a signal line, a power line, a switching TFT, and a driving TFT. In addition, the signal line and the power line cross the scanning line and are spaced apart from each other, wherein the switching TFT is disposed at the crossing of the scanning and signal lines and the driving TFT is disposed at the crossing of the scanning and the power lines.

At step st2, a first electrode of an organic EL diode is formed over the array elements, wherein the first electrode is connected to the driving TFT of each sub-pixel region.

At step st3, an emission layer of the organic EL diode is formed on the first electrode. If the first electrode is designed to function as an anode, the organic EL layer can be composed of a hole injection layer, a hole transporting layer, an emission layer, and an electron transporting layer.

At step st4, a second electrode of the EL diode is formed on the organic EL layer. The second electrode is formed over an entire surface of the first substrate to function as a common electrode.

At step st5, the first substrate is encapsulated with a second substrate, wherein the second substrate protects the first substrate from external impact and prevents damage of the organic EL layer due to ambient air. In addition, a moisture absorbent may be included in an inner surface of the second substrate.

Accordingly, an organic EL device is fabricated through encapsulating the first substrate including the array elements and the organic EL diode with the second substrate. Since the production yield of the array elements multiplied by the production yield of the organic EL diode determines the production yield of the organic EL device, the production yield of the whole process is greatly restricted by the process for forming the organic EL diode. For example, even when the array elements are properly fabricated, the organic EL diode may not be properly fabricated, and thus, the production yield is adversely effected.

The bottom emission-type organic EL device has high encapsulation stability and high process flexibility. However, since the aperture ratio is restricted, it is difficult to incorporate the bottom emission-type organic EL device into a device having high image resolution. On the other hand, since the top emission-type organic EL device is easily designed and has high aperture ratio, the top emission-type organic EL device has some advantages, such as long operational lifetime. However, since the cathode is generally formed on the organic EL layer in the organic EL device of the top emission-type EL device, transmittance is reduced due to limitation of material selection such that optical efficiency is reduced. In addition, when a thin film protection layer is used to minimize the reduction of the transmittance, infiltration of ambient air is increased.

SUMMARY OF THE INVENTION

Accordingly, the present invention is directed to an organic electroluminescent display device and a method of fabricating an organic electroluminescent display device that substantially obviate one or more of the problems due to limitations and disadvantages of the related art.

An object of the present invention is to provide a dual panel-type organic electroluminescent display device that has improved production yield, high image resolution, and high aperture ratio.

Another object of the present invention is to provide a method of fabricating a dual panel-type organic electroluminescent display device that has improved production yield, high image resolution, and high aperture ratio.

Another object of the present invention is to provide an organic electroluminescent display device that has improved connection properties between array elements and organic electroluminescent diodes.

Another object of the present invention is to provide a method of fabricating an organic electroluminescent display device that has improved connection properties between array elements and organic electroluminescent diodes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes first and second substrates facing and spaced apart from each other, the first and second substrates having a plurality of sub-pixel regions, a thin film transistor provided at each of the plurality of sub-pixel regions on an inner surface of the first substrate, a first electrode on an inner surface of the second substrate, an organic electroluminescent layer on the first electrode, a second electrode on the organic electroluminescent layer at each of the plurality of sub-pixel regions, and a connection pattern contacting the thin film transistor and the second electrode, wherein a melting temperature of the connection pattern is lower than a melting temperature of the second electrode.

In another aspect, a method of fabricating an organic electroluminescent display device includes forming a thin film transistor on a first substrate having a plurality of sub-pixel regions, the thin film transistor corresponding to each of the plurality of sub-pixel regions, forming a passivation layer on the thin film transistor, the passivation layer having a contact hole exposing the thin film transistor, forming a connection pattern on the passivation layer, the connection pattern contacting the thin film transistor through the contact hole, forming a first electrode on a second substrate having the plurality of sub-pixel regions, forming an organic electroluminescent layer on the first electrode, forming a second electrode on the organic electroluminescent layer, the second electrode corresponding to each of the plurality of sub-pixel regions, and attaching the first and second substrates such that the connection pattern contacts the second electrode, wherein a melting temperature of the connection pattern is lower than a melting temperature of the second electrode.

In another aspect, a method of fabricating an organic electroluminescent display device includes forming a thin film transistor on a first substrate having a plurality of sub-pixel regions, forming a passivation layer on the thin film transistor having a contact hole exposing the thin film transistor, forming a connection pattern on the passivation layer to contact the thin film transistor through the contact hole, forming a first electrode on a second substrate having the plurality of sub-pixel regions, forming an organic electroluminescent layer on the first electrode, forming a second electrode on the organic electroluminescent layer, and attaching the first and second substrates such that the connection pattern melts at a first temperature and contacts the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 5:
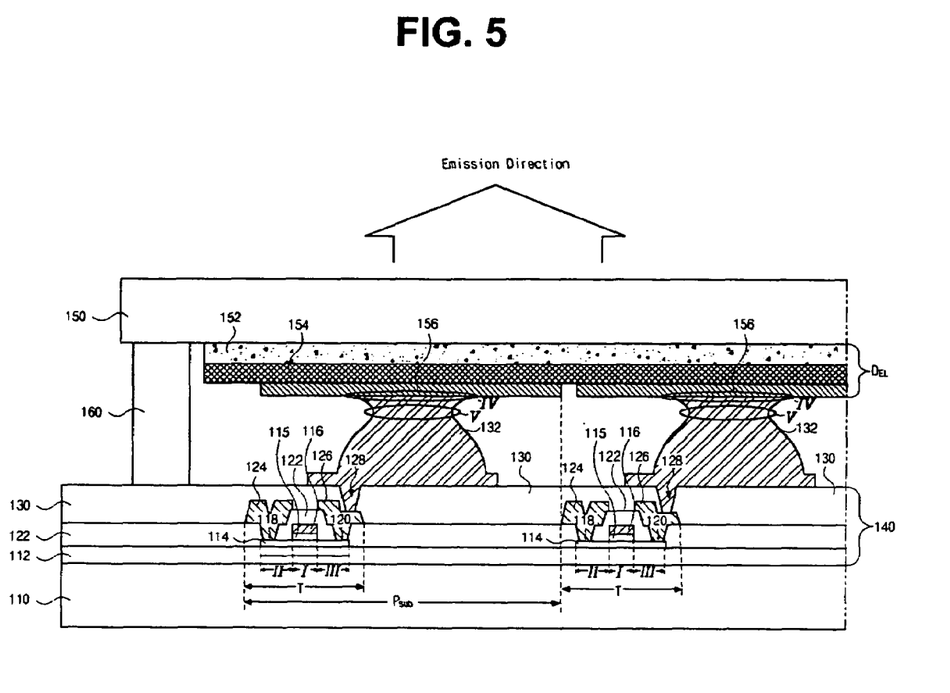
FIG. 5 is a schematic cross sectional view of an exemplary organic electroluminescent display device according to the present invention.

FIG. 5 is a schematic cross sectional view of an exemplary organic electroluminescent display device according to the present invention. In FIG. 5, first and second substrates 110 and 150 may be provided to face and be spaced apart from each other, wherein the first and second substrates 110 and 150 may have a plurality of sub-pixel regions "$P_{sub}$." In addition, an array element layer 140 including a thin film transistor (TFT) "T" may be formed on an inner surface of the first substrate 110 at each sub-pixel region "$P_{sub}$." Although not shown, the array element layer 140 may include a gate line, a data line, a power line, and a common line. Furthermore, a connection pattern 132 of a cylindrical shape may be formed on and connected to the TFT "T" of the array elements 140.

A first electrode 152 and an organic electroluminescent (EL) layer 154 may be sequentially formed on an inner surface of the second substrate 150, and a second electrode 156 may be formed on the organic EL layer 154 at each sub-pixel region "$P_{sub}$," wherein the second electrode 156 may contact the connection pattern 132. In addition, the first and second substrates 110 and 150 may be attached together using a seal pattern 160 formed along a peripheral portion of the first and second substrates 110 and 150.

The array element layer 140 may include buffer layer 112 formed on the inner surface of the first substrate 110, a semiconductor layer 114 having a channel region "I," and source and drain regions "II" and "III" formed on the buffer layer 112 at each sub-pixel region "$P_{sub}$." In addition, a gate insulating layer 115 and a gate electrode 116 may be sequentially formed on the semiconductor layer 114 of the channel region "I," and a first passivation layer 122 having first and second contact holes 118 and 120 may be formed on the gate electrode 116. For example, the first and second contact holes 118 and 120 may expose the source and drain regions "II" and "III," respectively. Then, source and drain electrodes 124 and 126 may be formed on the first passivation layer 122, wherein the source electrode 124 may be connected to the source region "II" through the first contact hole 118, and the drain electrode 126 may be connected to the drain region "III" through the second contact hole 120.

Next, a second passivation layer 130 having a third contact hole 128 may be formed on the source and drain electrodes 124 and 126, wherein the third contact hole 128 may expose the drain electrode 126. Then, a connection pattern 132 of a cylindrical shape, for example, may be formed on the second passivation layer 130 and may be connected to the drain electrode 126 through the third contact hole 128. Accordingly, the semiconductor layer 114, the gate electrode 116, and the source and drain electrodes 124 and 126 may constitute a thin film transistor (TFT) "T."

To improve contact property between the connection pattern 132 and the second electrode 156, the connection pattern 132 may include metallic material(s) having a melting temperature lower than a melting temperature of the other materials for an organic EL device. For example, a melting temperature of the connection pattern 132 may be lower than a melting temperature of the second electrode 156. Accordingly, when the first and second substrates 110 and 150 are attached together, the first and second substrates 110 and 150 are heated to a temperature range where only the connection pattern 132 selectively melts. Thus, adhesion may be improved between the connection pattern 132 and the second electrode 156. As a result, the connection pattern 132 may have a larger cross sectional area at a first portion "IV" that contacts the second electrode 156 than at a second portion "V" adjacent to the first portion "IV."

After an array element and an organic EL diode are formed on respective substrates, the respective substrates are attached together such that a connection pattern connects the array element and the organic EL diode. During the substrate attachment process, the connection pattern may have a melting temperature lower than a melting temperature of the organic EL diode, such that the organic EL diode may not suffer damage and the connection pattern melts. Since the melting connection pattern contacts the second electrode and is diffused along a surface of the second electrode due to surface tension, a cross sectional area of the connection pattern at a first portion that contacts the second electrode may be larger than a cross sectional area of a second portion adjacent to the first portion. Accordingly, adhesion may be improved.

The connection pattern 132 may include at least one of gallium indium (GaIn) alloy, lead tin (PbSn) alloy, lead tin silver (PbSnAg) alloy, tin indium (SnIn) alloy, tin indium copper (SnInCu) alloy, and tin indium silver (SnInAg) alloy. Although not shown in FIG. 5, a moisture absorbent may be formed at an interior of the seal pattern 160.

Figure 6:
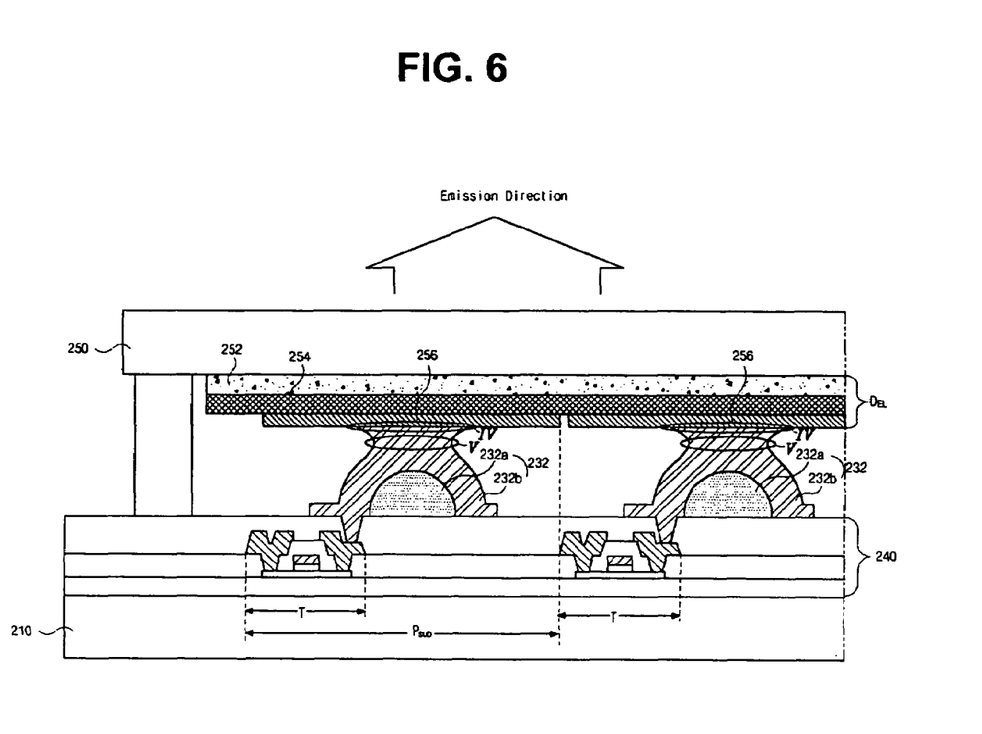
FIG. 6 is a schematic cross sectional view of another exemplary organic electroluminescent display device according to the present invention.

FIG. 6 is a schematic cross sectional view of another exemplary organic electroluminescent display device according to the present invention. In FIG. 6, first and second substrates 210 and 250 may be provided to face and be spaced apart from each other, wherein the first and second substrates 210 and 250 may have a plurality of sub-pixel regions "$P_{sub}$." In addition, an array element layer 240 including a thin film transistor (TFT) "T" may be formed on an inner surface of the first substrate 210 at each sub-pixel region "$P_{sub}$." Although not shown in FIG. 6, the array element layer 240 may include a gate line, a data line, a power line, and a common line. Then, a first electrode 252 and an organic electroluminescent (EL) layer 254 may be sequentially formed on an inner surface of the second substrate 250, and a second electrode 256 may be formed on the organic EL layer 254 at each sub-pixel region "$P_{sub}$." Accordingly, the organic EL device of FIG. 6 may be a top emission-type OELD device, wherein light may be emitted toward the first electrode 252.

In FIG. 6, a second pattern 232 may include a first pattern 232a of a hemispherical shape and having an island-shaped buffer pattern, and a second pattern 232b covering the first pattern 232a, wherein a flat surface of the first pattern 232a may face the array element layer 240. In addition, the second pattern 232b having a shape corresponding to the first pattern 232a may contact the TFT "T" and the second electrode 256. For example, the first pattern 232a may be formed of a photoresist through photolithographic processes including exposure and development steps. Moreover, the second pattern 232b may include metallic material(s) having a melting temperature lower than melting temperatures of the other materials for forming an organic EL device. For example, a melting temperature of the second pattern 232b may be lower than a melting temperature of the second electrode 256. The second pattern 232b may include at least one of gallium indium (GaIn) alloy, lead tin (PbSn) alloy, lead tin silver (PbSnAg) alloy, tin indium (SnIn) alloy, tin indium copper (SnInCu) alloy, and tin indium silver (SnInAg) alloy.

In FIG. 6, since the connection pattern 232 may have a double layer structure, it may be easy to adjust a thickness (height) of the connection pattern 232. Moreover, the second pattern 232b may have a larger cross sectional area at a first portion "IV" that contacts the second electrode 256 than at a second portion "V" adjacent to the first portion "IV," as shown in FIG. 5.

Figure 7A:
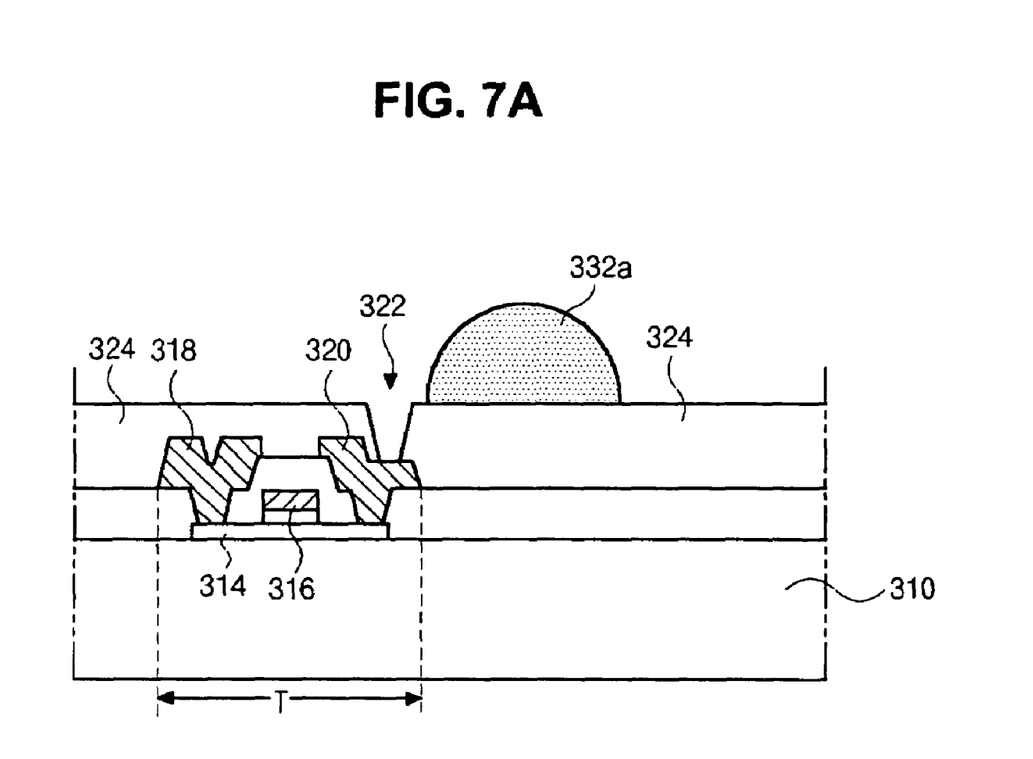
FIGS. 7A to 7C are schematic cross sectional views of an exemplary method of fabricating an organic electroluminescent display device according to the present invention.
Figure 7B:
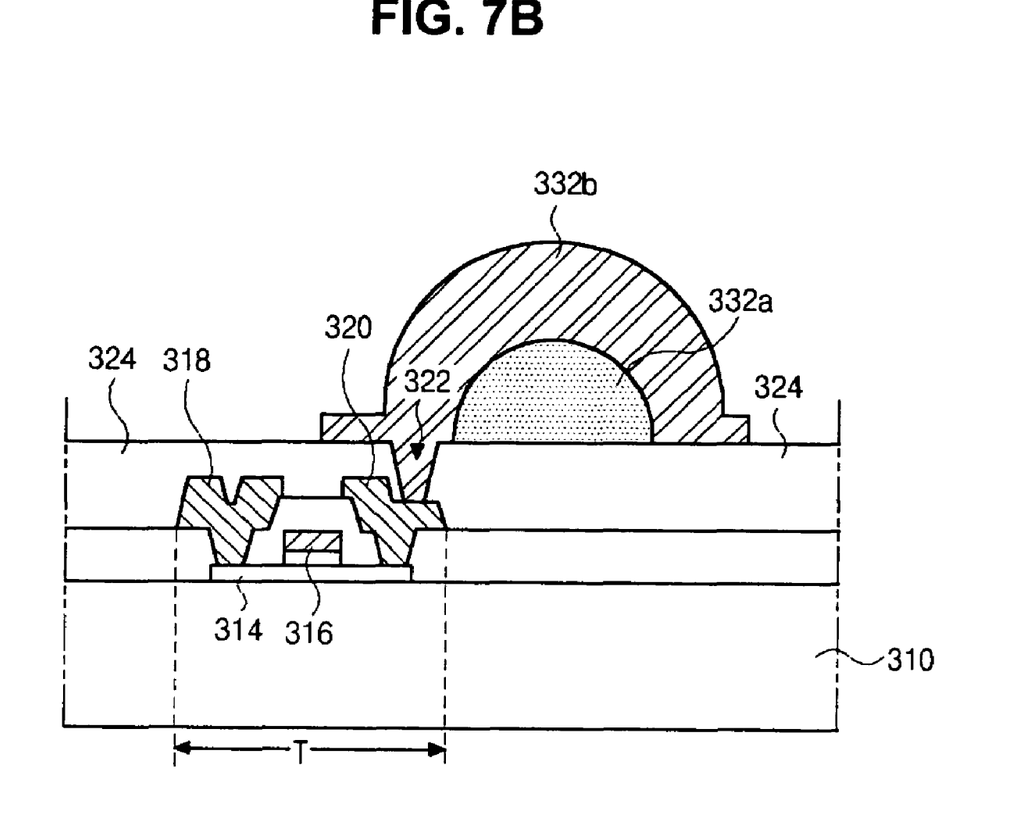
Figure 7C:
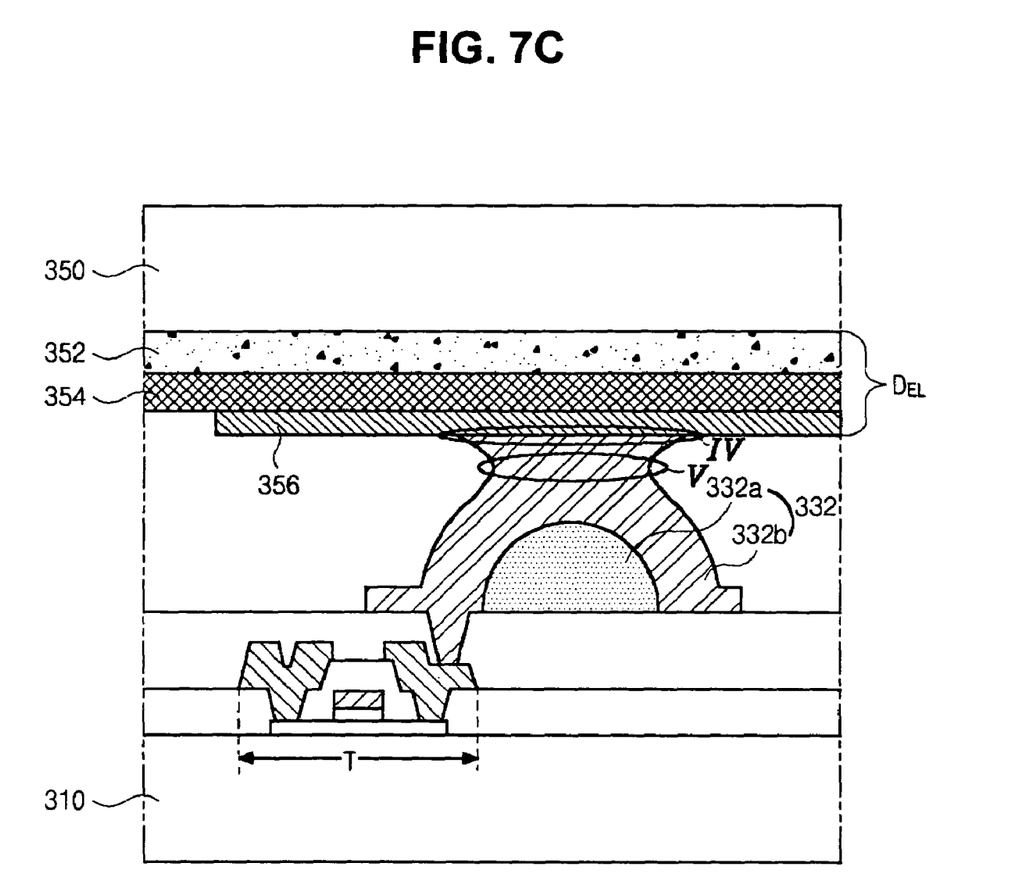

FIGS. 7A to 7C are schematic cross sectional views of an exemplary method of fabricating an organic electroluminescent display device according to the present invention. In FIG. 7A, a thin film transistor (TFT) "T" including a semiconductor layer 314, a gate electrode 316, and source and drain electrodes 318 and 320 may be formed on a first substrate 310, and a passivation layer 324 having a drain contact hole 322 may be formed on the TFT "T," wherein the drain contact hole 322 may expose the drain electrode 320. Next, a first pattern 332a of a hemispheric shape may be formed on the passivation layer 324, wherein the first pattern 332a may include insulating material(s), for example, a photoresist. Accordingly, the photoresist may be patterned to have a hemispherical shape such that a flat surface of the first pattern faces the passivation layer 324. Moreover, the first pattern 332a may be disposed adjacent to the drain contact hole 322 without filling the drain contact hole 322.

In FIG. 7B, a second pattern 332b may be formed on the first pattern 332a and may be connected to the drain electrode 320 through the drain contact hole 322. In addition, the second pattern 332b may have a structure corresponding to the first pattern 332a and may include metallic material(s) that have a lower melting temperature than melting temperatures of other materials for forming the organic electroluminescent (EL) device, i.e., a second electrode of a second substrate. The first and second patterns 332a and 332b may constitute a connection pattern 332, wherein the second pattern 332b may include at least one of gallium indium (GaIn) alloy, lead tin (PbSn) alloy, lead tin silver (PbSnAg) alloy, tin indium (SnIn) alloy, tin indium copper (SnInCu) alloy, and tin indium silver (SnInAg) alloy.

In FIG. 7C, a first electrode 352 may be formed on a second substrate 350, an organic EL layer 354 may be formed on the first electrode 352, and a second electrode 356 may be formed on the organic EL layer 354. The first and second electrodes 352 and 356, and the organic EL layer 354 interposed therebetween may constitute an organic EL diode "$D_{EL}$." Although not shown in FIG. 7C, a seal pattern may be formed along a peripheral portion on one, or both of the first and second substrates 310 and 350. After aligning the second substrate 350 with the first substrate 310 such that the second electrode 356 faces the connection pattern 332, the first and second substrates 310 and 350 may be attached together using the seal pattern (not shown). During the substrate attachment process, the second electrode 356 may contact the connection pattern 332.

When the second electrode 356 contacts the connection pattern 332, the first and second substrates 310 and 350 may be heated to improve contact properties between the second electrode 356 and the connection pattern 332. For example, the second electrode 356 and the connection pattern 332 may effectively contact each other by a welding method using pressure under a vacuum, whereby the first substrate 310 may be heated to within a temperature range where the metallic material(s) of the second pattern 332b melts. For example, the temperature range may be within about 100° C. to about 160° C. Since the second electrode 356 may contact the connection pattern 332 using the welding method, the second pattern 332b of the connection pattern 332 may have a larger cross sectional area at a first portion "IV" that contacts the second electrode 356 than at a second portion "V" adjacent to the first portion "IV." Accordingly, the contact properties between the second electrode 356 and the connection pattern 332 may be improved.

An organic electroluminescent device of the present invention has some advantages. First, production yield and production management efficiency are improved, and operational lifetime of an organic EL device is lengthened. Second, since an organic EL device is a top emission-type OELD device, a thin film transistor can be easily designed, and high aperture ratio and high image resolution may be obtained. Third, since an organic EL device has an encapsulation structure, an organic EL device may be protected from infiltration of ambient air. Fourth, since contact properties between an organic EL diode and a thin film transistor are improved, reliability is improved.

It will be apparent to those skilled in the art that various modifications and variations can be made in the organic electroluminescent display device and method of fabricating method an organic electroluminescent display device of the present invention without departing from the spirit or scope of the invention. Thus, it is intended that the present invention cover the modifications and variations of this invention provided they come within the scope of the appended claims and their equivalents.

What is claimed is:

1. A method of fabricating an organic electroluminescent display device, comprising:
   forming a thin film transistor on a first substrate having a plurality of sub-pixel regions, the thin film transistor corresponding to each of the plurality of sub-pixel regions;
   forming a passivation layer on the thin film transistor, the passivation layer having a contact hole exposing the thin film transistor;
   forming a connection pattern on the passivation layer, the connection pattern contacting the thin film transistor through the contact hole and having a first portion contacting the second electrode and a second portion adjacent to the first portion such that a cross sectional area of the first portion is larger than a cross sectional area of the second portion;
   forming a first electrode on a second substrate having the plurality of sub-pixel regions;
   forming an organic electroluminescent layer on the first electrode;
   forming a second electrode on the organic electroluminescent layer, the second electrode corresponding to each of the plurality of sub-pixel regions; and
   attaching the first and second substrates such that the connection pattern contacts the second electrode,
   wherein a melting temperature of the connection pattern is lower than a melting temperature of the second electrode.

2. The method according to claim 1, further comprising forming a seal pattern between the first and second substrates.

3. The method according to claim 1, wherein the connection pattern contacts the second electrode by welding.

4. The method according to claim 3, wherein the welding is performed under vacuum.

5. The method according to claim 3, wherein the first substrate is heated to a temperature within about 100° C. to about 160° C. during the welding.

6. The method according to claim 3, wherein the first and second substrates are pressurized during the welding.

7. The method according to claim 1, further comprising forming an island-shaped buffer pattern between the passivation layer and the connection pattern.

8. The method according to claim 7, wherein the buffer pattern has a hemispheric shape.

9. The method according to claim 7, wherein the buffer pattern includes one of photoresist, photo-acryl, and polyimide materials.

10. The method according to claim 1, wherein the connection electrode includes at least one of gallium indium (GaIn) alloy, lead tin (PbSn) alloy, lead tin silver (PbSnAg) alloy, tin indium (SnIn) alloy, tin indium copper (SnInCu) alloy, and tin indium silver (SnInAg) alloy.

11. The method according to claim 1, wherein the connection pattern contacts the second electrode by surface tension and diffusion.

12. A method of fabricating an organic electroluminescent display device, comprising:
   forming a thin film transistor on a first substrate having a plurality of sub-pixel regions;
   forming a passivation layer on the thin film transistor having a contact hole exposing the thin film transistor;
   forming a connection pattern on the passivation layer to contact the thin film transistor through the contact hole;
   forming a first electrode on a second substrate having the plurality of sub-pixel regions;
   forming an organic electroluminescent layer on the first electrode;
   forming a second electrode on the organic electroluminescent layer; and
   attaching the first and second substrates such that the connection pattern melts at a first temperature and contacts the second electrodes
   wherein the connection pattern contacts the second electrode by surface tension and diffusion.

13. The method according to claim 12, further comprising forming a seal pattern between the first and second substrates.

14. The method according to claim 12, wherein the connection pattern contacts the second electrode by welding.

15. The method according to claim 14, wherein the welding is performed under vacuum.

16. The method according to claim 14, wherein the first substrate is heated to a temperature within about 100° C. to about 160° C. during the welding.

17. The method according to claim 14, wherein the first and second substrates are pressurized during the welding.

18. The method according to claim 14, wherein the connection pattern has a first portion contacting the second electrode and a second portion adjacent to the first portion such that a cross sectional area of the first portion is larger than a cross sectional area of the second portion.

19. The method according to claim 12, further comprising forming an island-shaped buffer pattern between the passivation layer and the connection pattern.

20. The method according to claim 19, wherein the buffer pattern has a hemispheric shape.

21. The method according to claim 19, wherein the buffer pattern includes one of photoresist, photo-acryl, and polyimide materials.

22. The method according to claim 12, wherein the connection electrode includes at least one of gallium indium (GaIn) alloy, lead tin (PbSn) alloy, lead tin silver (PbSnAg) alloy, tin indium (SnIn) alloy, tin indium copper (SnInCu) alloy, and tin indium silver (SnInAg) alloy.

* * * * *